(12) United States Patent
Pschenitzka

(10) Patent No.: US 10,847,756 B2
(45) Date of Patent: Nov. 24, 2020

(54) INKJET PRINTING SYSTEMS AND TECHNIQUES FOR LIGHT-EMITTING DEVICES WITH ENHANCED LIGHT OUTCOUPLING

(71) Applicant: Kateeva, Inc., Newark, CA (US)

(72) Inventor: Florian Pschenitzka, San Francisco, CA (US)

(73) Assignee: KATEEVA, INC., Newark, CA (US)

(*) Notice: Subject to any disclaimer, the term of this patent is extended or adjusted under 35 U.S.C. 154(b) by 13 days.

(21) Appl. No.: 15/900,666

(22) Filed: Feb. 20, 2018

(65) Prior Publication Data

US 2018/0241007 A1 Aug. 23, 2018

Related U.S. Application Data

(60) Provisional application No. 62/461,186, filed on Feb. 20, 2017.

(51) Int. Cl.
| | |
|---|---|
| H01L 51/52 | (2006.01) |
| H01L 51/00 | (2006.01) |
| C09D 11/30 | (2014.01) |
| C09D 11/107 | (2014.01) |
| C09D 11/101 | (2014.01) |
| B41J 11/00 | (2006.01) |
| B41J 2/04 | (2006.01) |
| B41M 5/00 | (2006.01) |

(Continued)

(52) U.S. Cl.
CPC .......... *H01L 51/5275* (2013.01); *B41J 2/04* (2013.01); *B41J 11/002* (2013.01); *B41M 5/0023* (2013.01); *C09D 11/101* (2013.01); *C09D 11/107* (2013.01); *C09D 11/30* (2013.01); *H01L 51/004* (2013.01); *H01L 51/0043* (2013.01); *H01L 51/5206* (2013.01); *B41M 3/003* (2013.01); *B41M 3/008* (2013.01); *B41M 5/0047* (2013.01); *B41M 7/0081* (2013.01); *H01L 51/0096* (2013.01)

(58) Field of Classification Search
None
See application file for complete search history.

(56) References Cited

U.S. PATENT DOCUMENTS

2001/0048968 A1* 12/2001 Cox .......................... B41J 2/01
427/162
2005/0122035 A1 6/2005 Birnstock et al.
(Continued)

OTHER PUBLICATIONS

International Search Report and Written Opinion dated Apr. 13, 2018 for International Patent Application No. PCT/US18/18853.

*Primary Examiner* — Michelle Mandala
*Assistant Examiner* — Jordan M Klein
(74) *Attorney, Agent, or Firm* — Hauptman Ham, LLP

(57) ABSTRACT

The present teachings relate to various embodiments of ink compositions, which once printed and cured on a substrate form a continuous composite film layer that includes a first pattern of polymeric areas having a first refractive index (RI) interspersed within a second pattern of polymeric areas having an RI that is higher in comparison to the RI of the first pattern of polymeric areas. Various embodiments of composite thin films so formed on a substrate can be tuned so as to enhance light outcoupling or extraction for various light-emitting devices of the present teachings, such as, but not limited by, an OLED display or lighting device.

17 Claims, 7 Drawing Sheets

(51) Int. Cl.
*B41M 3/00* (2006.01)
*B41M 7/00* (2006.01)

(56) References Cited

U.S. PATENT DOCUMENTS

| | | | |
|---|---|---|---|
| 2010/0194717 A1* | 8/2010 | Mori | H01L 51/5268 345/204 |
| 2014/0138131 A1* | 5/2014 | Hao | G02B 1/115 174/257 |
| 2014/0332798 A1 | 11/2014 | Chen et al. | |
| 2015/0043221 A1* | 2/2015 | Lee | G02B 5/0236 362/311.03 |
| 2016/0308169 A1* | 10/2016 | Fleissner | H01L 51/5275 |
| 2017/0207421 A1* | 7/2017 | Matsuzaki | H01L 51/0096 |

* cited by examiner

| # | Monomer chemical identity | η, cP | ST, dynes/cm |
|---|---|---|---|
| 1 | Cyclic trimethylolpropane formal acrylate | 17.3 | 38.3 |
| 2 | propoxylated (2) neopentyl glycol diacrylate | 16.5 | 33.7 |
| 3 | Alkoxylated tetrahydrofurfuryl acrylate | 13.8 | 35.9 |
| 4 | 2-phenoxyethyl acrylate | 11.1 | 40.8 |
| 5 | 1,6-hexanediol diacrylate | 7.36 | 36 |
| 6 | 1,3-butylene glycol diacrylate | 6.99 | 33.7 |
| 7 | 2(2-ethoxyethoxy) ethyl acrylate | 3.56 | 32.2 |

FIG. 5

INKJET PRINTING SYSTEMS AND TECHNIQUES FOR LIGHT-EMITTING DEVICES WITH ENHANCED LIGHT OUTCOUPLING

OVERVIEW

Various light-emitting devices, such as various OLED display devices or OLED lighting devices, have architectures that include numerous functional layers surrounding a light-emitting layer. Such functional layers may have different refractive indices that create wave-guiding due to internal reflection within discrete layers defining the device architecture, thereby reducing the emission of light from the light-emitting device.

The present inventors have recognized that inkjet printing techniques can be used to provide light-emitting devices that enhance the outcoupling of light from the device, thereby enhancing device performance.

BRIEF DESCRIPTION OF THE DRAWINGS

A better understanding of the features and advantages of the present disclosure will be obtained by reference to the accompanying drawings, which are intended to illustrate, not limit, the present teachings. In the drawings, which are not necessarily drawn to scale, like numerals may describe similar components in different views. Like numerals having different letter suffixes may represent different instances of similar components.

FIG. 5 is a table illustrating generally monomers that can be used to prepare various embodiments of inks of the present teachings.

DETAILED DESCRIPTION OF THE DISCLOSURE

The present teachings relate to various embodiments of ink compositions, which once printed and cured on a substrate can form a continuous composite film layer that includes a first pattern of polymeric areas having a first refractive index (RI) interspersed within a second pattern of polymeric areas having an RI that is higher in comparison to the first pattern of polymeric areas. Various embodiments of composite thin films so formed a substrate can be tuned so as to enhance light outcoupling or extraction, such as, by way of non-limiting examples, for a bottom-emitting display device, various OLED lighting devices, and related light-emitting devices.

According to the present teachings, the effective refractive index of a first pattern of polymeric areas in a composite film layer deposited on a substrate can be tuned to match or closely match the refractive index of the device substrate through which light from an light-emitting layer of the device is emitted. Additionally, the effective refractive index of a second pattern of polymeric areas in a composite film layer deposited on a substrate can be tuned to match or closely match higher refractive index of layers of a display device stack in which wave-guiding due to internal reflection occurs, thereby enhancing the light that can be emitted towards the substrate and then through the substrate via the first pattern of polymeric areas that are tuned to match or closely match the refractive index of the substrate. As such, various embodiments of a composite film layer of the present teachings can provide effective light outcoupling from, for example, a display device, as well as various light-emitting devices, through a composite polymeric layer on a substrate providing discrete regions of variable RI that enable enhanced outcoupling of light through a substrate in the direction of viewing. The composite film layer can be fabricated such that the refractive index of a first region to closer to that of the substrate than to an overlying device layer, while the refractive index of a second region is closer to that of the overlying device layer than to the substrate.

Various embodiments of inks of the present teachings can be printed using an industrial inkjet printing system that can be housed in a gas enclosure, which gas enclosure defines an interior that has a controlled environment maintained as an inert and substantially low-particle process environment. Patterned printing of a composite film layer of the present teachings on a substrate, for example, but not limited by, an OLED device substrate, in such a controlled environment can ensure a high-volume, high yield process for a variety of light-emitting devices.

Figure 1:
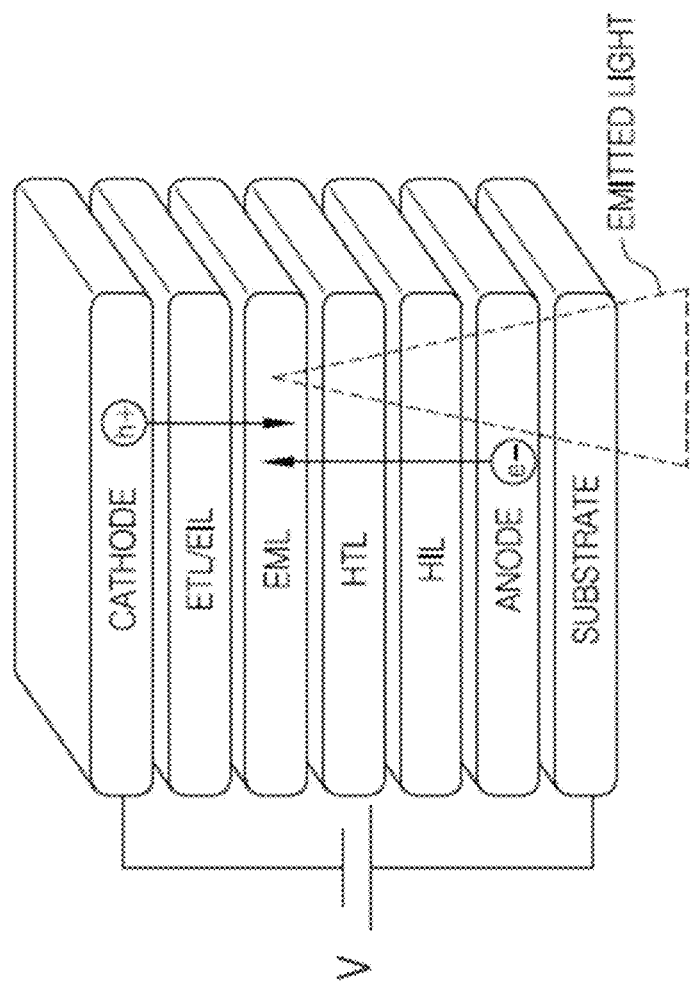
FIG. 1 illustrates generally a schematic of a display device according to various embodiments of techniques and devices of present teachings.

FIG. 1 illustrates generally a bottom-emitting light-emitting device. During the manufacture of such a device, such as an OLED display or an OLED light-emitting device, an OLED film stack can be formed, which can emit light of a specific peak wavelength when a voltage is applied. As depicted in FIG. 1, an OLED film stack structure between an anode and a cathode can include a hole injection layer (HIL), a hole transport layer (HTL), an emissive layer (EML), an electron transport layer (ETL) and an electron injection layer (EIL). As depicted in FIG. 1, in some embodiments of an OLED film stack structure, an electron transport layer (ETL) can be combined with an electron injection layer (EIL) to form an ETL/EIL layer. As will be discussed in more detail subsequently herein, for a bottom-emitting device, such as that shown in FIG. 1, an anode material can be a transparent film material, such as indium tin oxide (ITO), or metal nanowire-patterned structures.

The present inventors have recognized that inkjet printing can enable pattered printing desirable for the formation various embodiments of a composite film layer of the present teachings. A composite film layer of the present teachings can be printed on a variety of device substrates, for example, glass substrates or various polymeric substrates, such as substrates formed from the class of polymers such as polyimide, polyethylene terephthalate, cyclic olefin copolymer, and the like.

Various inks for the preparation of a composite layer of the present teachings can include a polymer or polymer component, for example, but not limited by, various polyethylene glycol monomer materials, an acrylate, such as a mono- or multidentate acrylate, a methacrylate, such as a mono- or multidentate methacrylate, or other material, as well as copolymers and mixtures thereof. Various ink formulations used for the fabrication of a composite film layer of the present teachings can include nanoparticles for the purpose of enhancing light extraction from light emitted from an emissive layer in a device stack and emitted through the substrate via the composite film layer. The nanoparticles are typically characterized in that they have one or more dimensions of less than 1000 nm. Various ink compositions of the present teachings can be cured using thermal processing (e.g. bake), UV exposure, and combinations thereof. As used herein polymer and copolymer can include any form of a polymer component that can be formulated into an ink and cured on a substrate to form a composite film layer. Such polymeric components can include polymers and copolymers, as well as precursors thereof, for example, but not limited by, monomers, oligomers, and resins.

According to the present teachings, inkjet printing can provide several advantages. First, a range of vacuum processing operations can be eliminated because such inkjet-based fabrication can be performed at atmospheric pressure. Additionally, during an inkjet printing process, a composite film layer that can include a first region of formed from a first ink and a second region formed from a second ink can be readily fabricated using inkjet printing; enabling various embodiments of a composite film of the present teachings. The targeted patterning using inkjet printing results in eliminating material waste, as well as eliminating additional processing typically required to achieve patterning of a composite layer of the present teachings, such as processing involving the use of multiple masks to produce a complex pattern of regions of variable RI.

For selectively adjusting the refractive index of various regions of a composite film of the present teachings, nanoparticles (NPs) can be included in various ink compositions. When NPs are incorporated into various regions of a composite film layer of the present teachings they can provide enhanced light extraction, by adjusting the refractive index (RI) of a formed region to a desired effective RI. Some exemplary NPs can include, by way of non-limiting example, inorganic nanoparticles, including metal oxide NPs, such as NPs of zirconium oxide (i.e. zirconia), titanium oxide (i.e. titania) and aluminum oxide (i.e. alumina). Various NPs can be incorporated into regions of a composite film formed on the substrate of a light-emitting device by including them in an ink composition, and depositing them by inkjet printing. An effective nanoparticle size of between about 10 nm to about 100 nm can be selected for use in a jettable ink. As will be discussed in more detail herein, various embodiments of ink compositions for use in printing the NP-containing region of a composite film layer formed on a substrate of a light-emitting device may have a NP loading in a concentration in the range from about 1 wt. % to about 60 wt. %.

Figure 2:
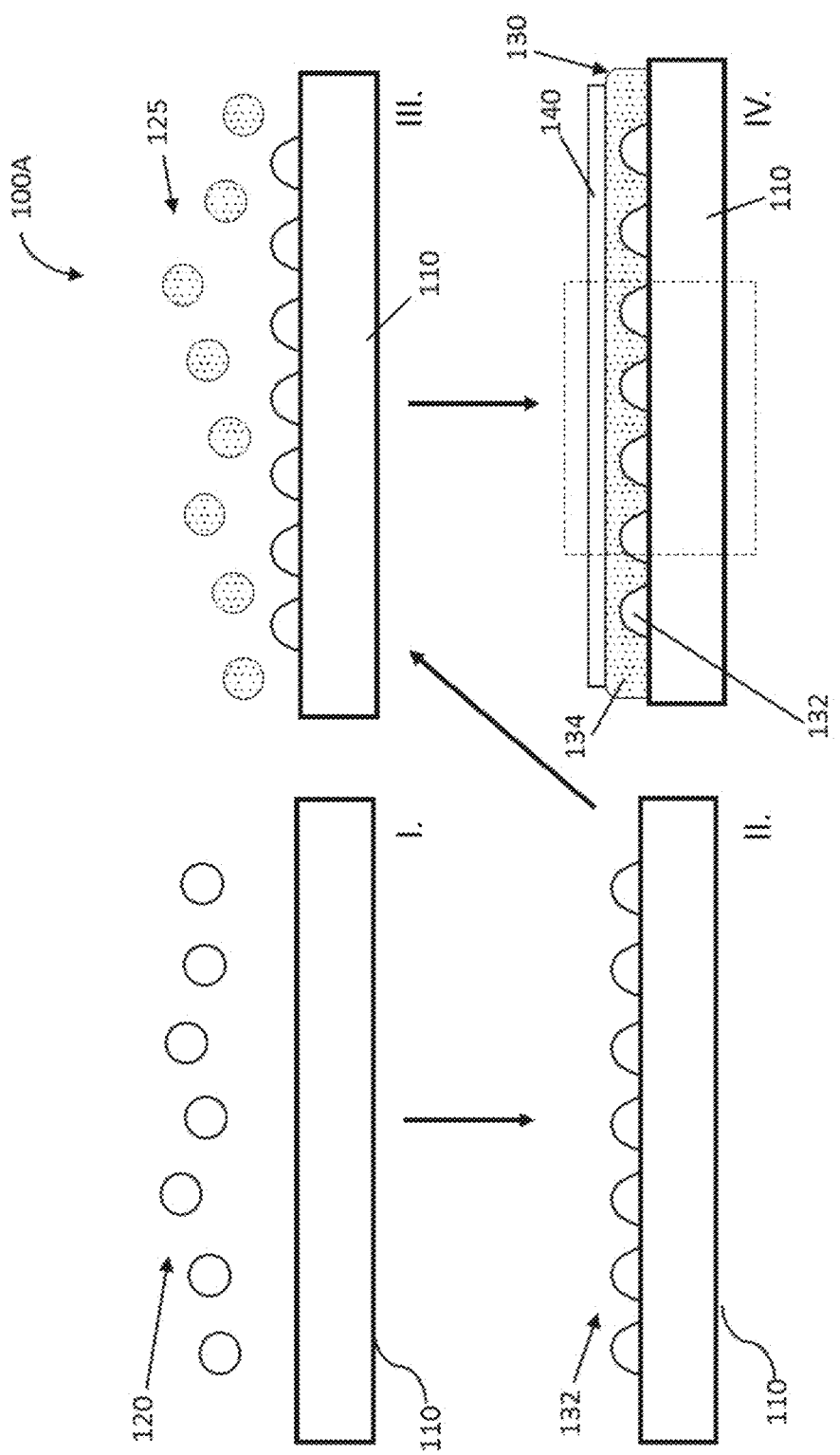
FIG. 2 illustrates generally a process flow and device according to various embodiments of techniques and devices of present teachings.

FIG. 2 includes a series of section views that illustrates generally a process flow and device 100A according to various embodiments of techniques and devices of present teachings. As shown in segment I of FIG. 2, droplets 120 of a first ink can be deposited on substrate 110 so as to create a defined pattern of deposited ink, which when cured can form, for example, a pattern of dome or lenslet polymer structures 132 as shown in segment II of FIG. 2. By using inkjet printing, any pattern of polymer structures 132 can be fabricated on substrate 110; whether a regular or randomized pattern deposited over the surface of substrate 110. As depicted in segment III of FIG. 2, droplets 125 of a second ink can be deposited on substrate 110 upon which structures 132 have been formed, and when cured can form composite film layer 130, that includes polymeric structures 132 with a first refractive index matching or closing matching the refractive index of substrate 110 and polymer matrix 134 having a refractive index matching or closely matching transparent electrode layer 140. Composite film 130 once formed on substrate 110 can present a planarized surface for the deposition of an anode layer (see FIG. 1), such as film layer 140. As previously discussed herein, film layer 140 can be a transparent electrode material, such as ITO. Additionally, a metal nanowire-patterned structure can also be used for to create an anode for various embodiments of light-emitting devices of the present teachings. Accordingly, as depicted in FIG. 2, various embodiments of a composite film layer of the present teachings, such as composite film layer 130, can have regions of contact with substrate 110 having a first refractive index as a result of the deposition of a first ink, and regions of contact with substrate 110 having a second refractive index as a result of the deposition of a second ink.

According to the present teachings, a first ink can be a composition including a polymer or polymer component, for example, but not limited by, various polyethylene glycol monomer materials, an acrylate, such as a mono- or multi-dentate acrylate, a methacrylate, such as a mono- or multi-dentate methacrylate, or other material, as well as copolymers and mixtures thereof. Such polymeric inks can form polymer structures 132 that have a refractive index of between about 1.45 to about 1.50 and therefore have a refractive index that matches or closely matches the refractive index of substrate 110, which can be glass or various polymeric materials, such as a polymeric material of the class of polymers such as polyimide, polyethylene terephthalate, cyclic olefin copolymer, and the like. According to the present teachings, a second ink can include a polymer matrix as described for various embodiments of a first ink, but can have an effective index of refraction that is adjusted to between about 1.6 to about 1.9 using by the specific selection and loading of NPs as part of the ink composition.

Figure 3:
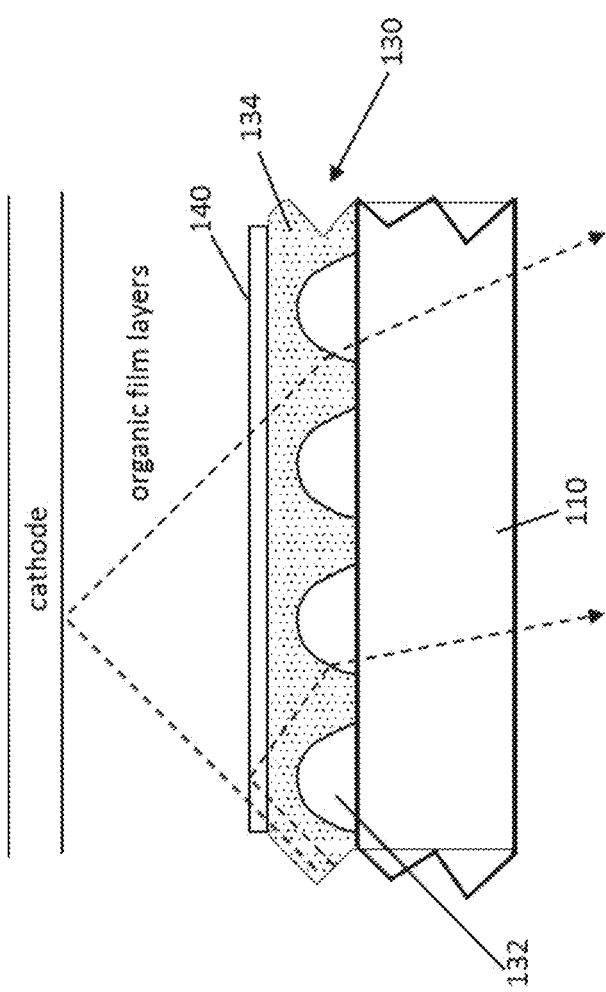
FIG. 3 depicts an expanded view of the device of FIG. 2, additionally illustrating enhanced light outcoupling according to the present teachings.

Though not bound by theory or explanation, FIG. 3 illustrates generally how various embodiments of a composite film layer of the present teachings can function to enhance outcoupling of light from a display device. Various embodiments of an ITO layer can have a refractive index of between about 1.6 to 1.9. Additionally, as depicted in FIG. 1, various stack layers of a display device including the anode, HIL, HTL, and EML can also have indices of refraction that are in the range of 1.6 to 1.9. In contrast, various embodiments of substrate 110 of FIG. 3, for example, glass substrates or various polymeric substrates, such as substrates formed from the class of polymers such as polyimide, polyethylene terephthalate, cyclic olefin copolymer, and the like, can have refractive indices in the range of 1.45 to 1.5. The disparity of refractive indices can result in internal reflection through film layers having higher indices of refraction in comparison to substrate 110. However, for various embodiments of a composite film of the present teachings, such as composite film 130 of FIG. 3, light (represented by dashed lines in the figure) initially refracted from ITO layer 140, as well as through the organic film layers, such as the HIL, HTL, and EML layers (see FIG. 1) can be transmitted through polymer matrix 134 that includes NPs so that its refractive index matches or closely matches the refractive index of transparent electrode layer 140. When light interacts with polymeric structures 132, having an index of refraction matching or closely matching substrate 110 it can be outcoupled through the substrate in the direction of view of the display device. By way of illustration only, the RI of one material can be considered to closely match the RI of another material if the RIs of the two materials differ by no more than 10%. This includes embodiments in which the RIs of the two materials differ by no more than 5% and further includes embodiments in which the RIs of the two materials differ by no more than 1%.

Figure 4:
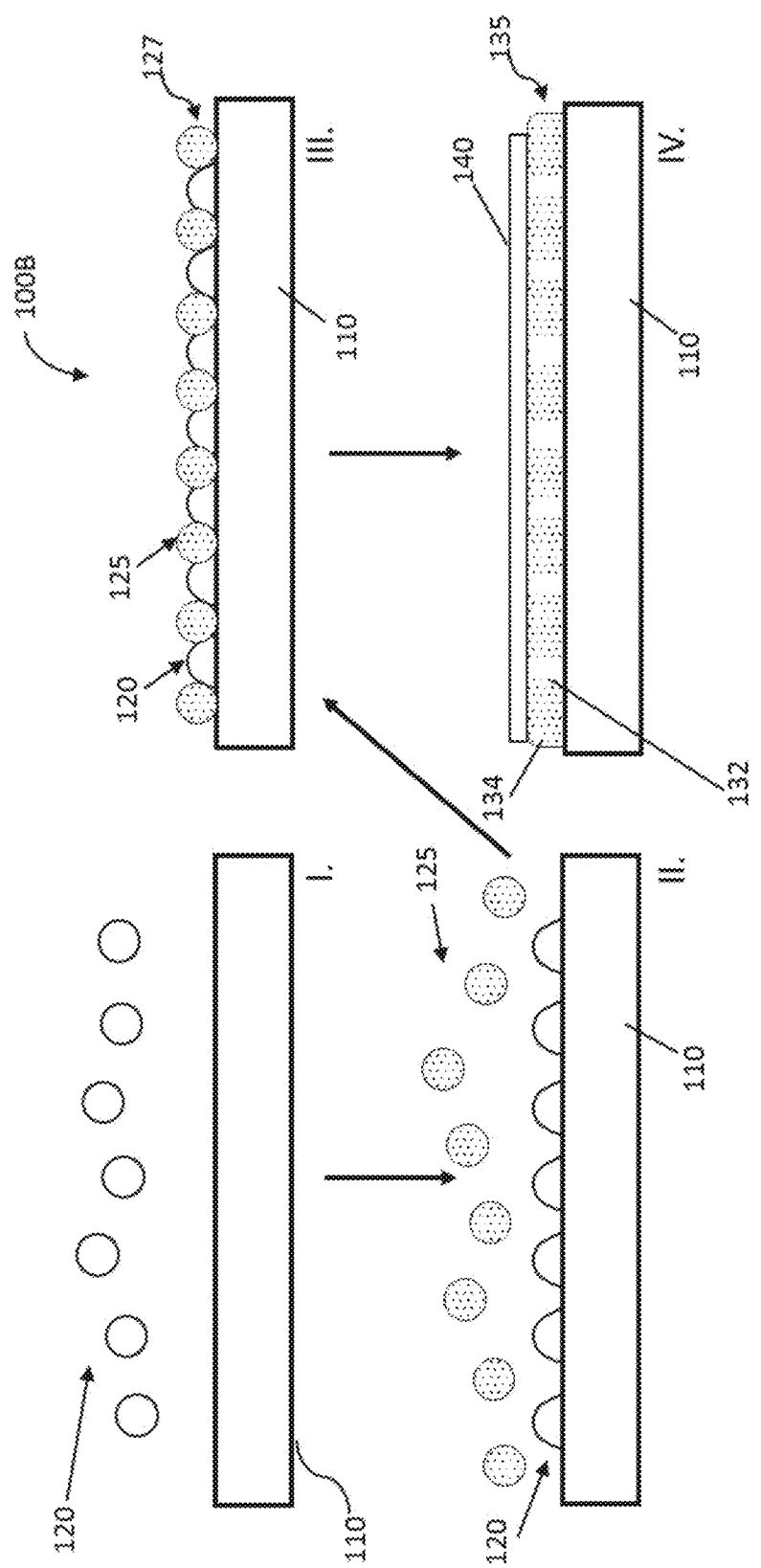
FIG. 4 illustrates generally a process flow and device according to various embodiments of techniques and devices of present teachings.

FIG. 4 includes a series of section views that illustrates generally a process flow and device 100B according to various embodiments of techniques and devices of present teachings. As per the process and device of FIG. 2, in segment I of FIG. 4, droplets 120 of a first ink can be deposited on substrate 110 so as to create a pattern of deposited ink. However, in various embodiments of a process and device of FIG. 4, without curing droplets of a first ink before depositing a second ink, in a sequential printing process, as depicted in segment II of FIG. 4, droplets 125 of a second ink can be deposited on substrate 110 upon which droplets 120 of a first ink have been deposited, so that composite ink layer 127 is formed as a first pattern of a first ink and a second pattern of a second ink as illustrated generally in segment III of FIG. 4. Though some diffusion can occur between deposition of composite ink layer 127 and curing, inks and processes can be created so that composite ink layer 127 when cured can form composite film layer 135. In this embodiment of the methods, the first and second inks are sufficiently immiscible to prevent the complete or substantially complete mixing of the two inks on the timescale of the ink deposition process. The inks can be rendered immiscible through, for example, the selection of solvents and/or monomers. Composite film layer 135 can include polymeric regions 132 with a first refractive index matching or closing matching the refractive index of substrate 110 and polymer regions 134 having a refractive index matching or closely matching transparent electrode layer 140. As previously discussed herein for device 100A of FIG. 2, composite film 135 once formed on substrate 110 can present a planarized surface for the deposition of an anode layer (see FIG. 1), such as film layer 140. As previously discussed herein, film layer 140 can be a transparent electrode material, such as ITO. Additionally, a metal nanowire-patterned structure can also be used for to create an anode for various embodiments of display devices of the present teachings. Accordingly, as depicted in FIG. 4, various embodiments of a composite film layer of the present teachings, such as composite film layer 135, can have regions of contact with substrate 110 having a first refractive index as a result of the deposition of a first ink, and regions of contact with substrate 110 having a second refractive index as a result of the deposition of a second ink. According to the present teachings, various embodiments of a composite film layer of FIG. 4 may function as illustrated generally in FIG. 3.

In one embodiment of a method of forming a composite film having regions of differing refractive index, a film is formed on a substrate by: depositing a first ink on a substrate in a first-defined pattern; said first-defined pattern configured to create a second-defined pattern on the substrate, wherein the first ink is configured to produce a first-patterned film that has a refractive index that is substantially the same as the refractive index of the substrate; depositing a second ink on the substrate in the second-defined pattern; wherein the second ink is configured to produce a second-patterned film that has a refractive index that is greater than the refractive index of the substrate; and depositing at least one thin film layer over the substrate, wherein the at least one thin film layer has a refractive index that is substantially the same as the second-patterned film.

Ink Compositions

The following teachings relate to various embodiments of ink compositions which, once printed and dried or cured, form thin polymeric layers on an optoelectronic device substrate, such as, but not limited by, a light emitting device, such as an OLED display or lighting device. Various embodiments of the ink compositions can be printed using an industrial inkjet printing system that can be housed in a gas enclosure, which gas enclosure defines an interior that has a controlled environment maintained as an inert and substantially low-particle process environment. Patterned printing to from a composite film on a substrate in the fabrication of a light-emitting device in such a controlled environment can ensure a high-volume, high yield process for a variety of light-emitting devices, such as, but not limited by, an OLED display or lighting device. According to the present teachings, various ink compositions for a light-emitting device can be inkjet printed using various ink compositions tailored for the formation of the patterned printing of low RI regions interspersed within higher RI regions in which the higher RI regions can contain NPs.

The ink compositions include a polymer component, for example, but not limited by, various acrylate monomers, such as a mono- or multidentate acrylates; various methacrylate monomers, such as a mono- or multidentate methacrylates; and copolymers and mixtures thereof. The inks used to form the first and second patterned regions on a substrate may include the same monomers, as in the case where the first ink is dried or cured before the second ink is deposited. Alternatively, the inks may include different monomers, as in the case where both inks are deposited before drying or curing. The polymer component can be cured using thermal processing (e.g. bake), ultraviolet (UV) exposure, and combinations thereof. As used herein polymer and copolymer can include any form of a polymer component that can be formulated into an ink and cured on a substrate to form a composite film layer. Such polymeric components can include polymers and copolymers, as well as precursors thereof, for example, but not limited by, monomers, oligomers, and resins. As previously discussed herein, various embodiments of ink compositions of the present teachings further include nanoparticles (NPs) for adjusting the RI of various regions of a composite thin film of the present teachings.

According to the present teachings, inkjet printing can provide several advantages. First, a range of vacuum processing operations can be eliminated because such inkjet-based fabrication can be performed at atmospheric pressure. Additionally, during an inkjet printing process, a printed layer can be precisely localized and patterned on a substrate. Moreover, inkjet printing can be used to vary the particle density, the film thickness, or both along the length of a printed layer, as illustrated in FIGS. 3-7.

Composite Film Ink Compositions and Methods

Various embodiments of ink compositions of the present teachings can be inkjet printed in a target print area on, for example, but not limited by, a light-emitting device, such as an OLED display device, or lighting device, to form a composite polymeric film layer enabling enhanced light-outcoupling from various light-emitting devices of the present teachings.

The thin layer ink compositions include one or more mono(meth)acrylate monomers, one or more di(meth)acrylate monomers, or a combination of mono(meth)acrylate and di(meth)acrylate monomers, in addition to a multifunctional crosslinking agent. As used herein, the phrase "(meth)acrylate monomer" indicates that the recited monomer may be an acrylate or a methacrylate. Some embodiments of the ink compositions further include cure initiators, such as photoinitiations, thermal initiators, or electon beam initiators. Ink-jettable ink compositions of this type that may be used to print one or more of ink compositions used to form various embodiments of a composite film layer of the present teachings are described in U.S. patent application publication number 2016/0024322 filed on Jul. 22, 2015; U.S. patent application publication number 2017/0062762, filed on Jul. 19, 2016; U.S. patent application publication number 2017/0358775, filed on Jun. 10, 2016; and U.S. patent application Ser. No. 15/727,551, filed on Oct. 6, 2017, the entire contents of which are incorporated herein by reference.

The mono(meth)acrylate and di(meth)acrylate monomers have properties that render them suitable for use in inkjet printing applications. As components of an ink composition, these monomers can provide compositions that are jettable at a range of inkjet printing temperatures, including room temperature. Generally, for ink compositions useful for inkjet printing applications, the surface tension, viscosity and wetting properties of the ink compositions should be tailored to allow the compositions to be dispensed through an inkjet printing nozzle without drying onto or clogging the nozzle at the temperature used for printing (e.g., room temperature, ~22° C., or at higher temperatures up to, for example, about 50° C.). Once formulated, various embodiments of the ink compositions can have a viscosity of between about 2 cps and about 30 cps (including, for example, between about 10 cps and about 27 cps and between about 14 cps and about 25 cps) at a temperature in the range from 22° C. to 50° C. and a surface tension of between about 25 dynes/cm and about 45 dynes/cm (including, for example, between about 30 dynes/cm and about 42 dynes/cm and between about 28 dynes/cm and about 38 dynes/cm) at a temperature in the range from 22° C. to 50° C. The suitable viscosities and surface tensions for the individual monomers used in the ink compositions will depend on the viscosities and surface tensions for the other components present in a given ink composition and on the relative amounts of each component in the ink composition. Generally, however, the mono(meth)acrylate monomers and the di(meth)acrylate monomers will have a viscosity in the range from about 4 cps to about 22 cps at a temperature in the range from 22° C. to 50° C., including about 4 cps to about 18 cps at a temperature in the range from 22° C. to 50° C., and a surface tension in the range from about 30 dynes/cm to 41 dynes/cm at a temperature in the range from 22° C. to 50° C., including in the range from about 32 dynes/cm to 41 dynes/cm at a temperature in the range from 22° C. to 50° C. Methods for measuring viscosities and surface tensions are well known and include the use of commercially available rheometers (e.g., a DV-I Prime Brookfield rheometer) and tensiometers (e.g., a SITA bubble pressure tensiometer).

In some embodiments of the ink compositions with a high nanoparticle loading, organic solvents can be added to adjust the viscosity and/or surface tension of the ink compositions if the viscosity and/or surface tensions of the ink compositions fall outside of these ranges in the absence of organic solvents. Suitable organic solvents include esters and ethers. Examples of organic solvents that can be included in the ink compositions include high boiling organic solvents, including organic solvents having a boiling point of at least 200° C. This includes organic solvents that have boiling points of at least 230° C., at least 250° C., or even at least 280° C. Diols and glycols, such as propanediols, pentanediols, diethylene glycols and triethylene glycols, are examples of high boiling organic solvents that can be used. High boiling aprotic solvents can also be used, including aprotic solvents having boiling points of at least 240° C. Sulfolane, 2,3,4,5-tetrahydrothiophene-1,1-dioxide, also known as tetramethylene sulfone, is an example of a relatively high boiling, aprotic solvent. Other non-limiting exemplary organic solvents can include toluene, xylenes, mesitylene, propylene glycol methyl ethers, methyl naphthalene, methyl benzoate, tetrahydronaphthalene, dimethyl formamide, terpineol, phenoxyethanol, and butyrophenone.

The mono(meth)acrylate monomers and di(meth)acrylate monomers can be, for example, linear aliphatic mono(meth)acrylates and di(meth)acrylates, or can include cyclic and/or aromatic groups. In various embodiments of the inkjet printable ink compositions, the mono(meth)acrylate monomers and/or di(meth)acrylate monomers are polyethers. In various embodiments of the inkjet printable ink compositions, the di(meth)acrylate monomers are alkoxylated aliphatic di(meth)acrylate monomers. These include 1,6-hexanediol diacrylate, 1,12-dodecanediol di(meth)acrylate and neopentyl glycol group-containing di(meth)acrylates, including alkoxylated neopentyl glycol diacrylates, such as neopentyl glycol propoxylate di(meth)acrylate and neopentyl glycol ethoxylate di(meth)acrylate. Various embodiments of the neopentyl glycol group-containing di(meth)acrylates have number average molecular weights in the range from about 200 g/mole to about 400 g/mole. This includes neopentyl glycol-containing di(meth)acrylates having number average molecular weights in the range from about 280 g/mole to about 350 g/mole and further includes neopentyl glycol-containing di(meth)acrylates having number average molecular weights in the range from about 300 g/mole to about 330 g/mole. Various neopentyl glycol group-containing di(meth)acrylate monomers are commercially available. For example, neopentyl glycol propoxylate diacrylate can be purchased from Sartomer Corporation under the tradename SR9003B and also from Sigma Aldrich Corporation under the tradename Aldrich-412147 (~330 g/mole; viscosity ~18 cps at 24° C.; surface tension ~34 dynes/cm at 24° C.). Neopentyl glycol diacrylate also can be purchased from Sigma Aldrich Corporation under the tradename Aldrich-408255 (~212 g/mole; viscosity ~7 cps; surface tension ~33 dynes/cm).

Other suitable (meth)acrylate monomers include, but are not limited to, alkyl(meth)acrylates, such as methyl (meth)acrylate and ethyl (meth)acrylate; cyclic trimethylolpropane formal (meth)acrylate; alkoxylated tetrahydrofurfuryl (meth)acrylate; phenoxyalkyl (meth)acrylates, such as 2-phenoxyethyl (meth)acrylate and phenoxymethyl (meth)acrylate; and 2(2-ethoxyethoxy)ethyl (meth)acrylate. The structures, room temperature viscosities, and room temperatures surface tensions for certain of these (meth)acrylate monomers are provided in FIG. 5. Still other suitable mono- and di(meth)acrylate monomers include polyethylene glycol di(meth)acrylate monomers, including those having a number average molecular weight in the range from about 230 g/mole to about 440 g/mole. For example, the ink compositions can include polyethylene glycol 200 dimethacrylate and/or polyethylene glycol 200 diacrylate, having a number average molecular weight of about 330 g/mole. Other mono- and di(meth)acrylate monomers that can be included in various embodiments of the ink compositions, alone or in combination, include dicyclopentenyloxyethyl acrylate (DCPOEA), isobornyl acrylate (ISOBA), dicyclopentenyloxyethyl methacrylate (DCPOEMA), isobornyl methacrylate (ISOBMA), and N-octadecyl methacrylate (OctaM). Homologs of ISOBA and ISOBMA (collectively "ISOB(M)A" homologs) in which one or more of the methyl groups on the ring is replaced by hydrogen can also be used.

The multifunctional (meth)acrylate crosslinking agents desirably have at least three reactive crosslinkable groups, such as (meth)acrylate groups or vinyl groups. Thus, the multifunctional (meth)acrylate crosslinking agents can be, for example, tri(meth)acrylates, tetra(meth)acrylates and/or higher functionality (meth)acrylates. Pentaerythritol tetraacrylate or pentaerythritol tetramethacrylate, di(trimethylolpropane) tetraacrylate and di(trimethylolpropane) tetramethacrylate are examples of multifunctional (meth)acrylates that can be used as a primary cross-linking agent. The term 'primary' is used here to indicate that other components of the ink compositions may also participate in crosslinking, although that is not their main functional purpose. Photoinitiators can also, optionally, be included in the ink compositions for initiating the polymerization process.

In some embodiments of the ink compositions, the mono(meth)acrylate and di(meth)acrylate monomers are the primary component in the ink compositions on a weight basis. Various embodiments of these ink compositions have a mono(meth)acrylate and/or di(meth)acrylate monomer content in the range from about 70 wt. % to about 96 wt. %. That is, the combined weight of the mono(meth)acrylate and di(meth)acrylate monomers accounts for about 70 wt. % to about 96 wt. % of the ink composition. This includes embodiments of the ink compositions having a mono(meth)acrylate and di(meth)acrylate monomer content in the range from about 75 wt. % to 95 wt. % and further includes embodiments of the ink compositions having a mono(meth)acrylate and di(meth)acrylate monomer content in the range from about 80 wt. % to 90 wt. %. Some embodiments of the ink composition include only a single mono(meth)acrylate monomer or a single di(meth)acrylate monomer, while others include a mixture of two or more mono(meth)acrylate monomers and/or two or more di(meth)acrylate monomers. For example, various embodiments of the ink compositions include two mono(meth)acrylate monomers, two di(meth)acrylate monomers, or a mono(meth)acrylate monomer in combination with a di(meth)acrylate monomer. The weight ratios of the two monomers can vary significantly in order to tailor the viscosity, surface tension, and film-forming properties of the ink compositions. By way of illustration, some embodiments of the ink compositions that include two of the mono- or di(meth)acrylate monomers include a first mono(meth)acrylate or di(meth)acrylate monomer and a second mono(meth)acrylate or di(meth)acrylate monomer in a weight ratio in the range from 95:1 to 1.2, including in a weight ratio range from 12:5 to 1:2. This includes embodiments of the ink compositions in which the weight ratio of the first mono(meth)acrylate or di(meth)acrylate monomer to the second mono(meth)acrylate or di(meth)acrylate monomer is in the range from 12:5 to 4:5; further includes embodiments of the ink compositions in which the weight ratio of the first mono(meth)acrylate or di(meth)acrylate monomer to the second mono(meth)acrylate or di(meth)acrylate monomer is in the range from 5:4 to 1:2; and still further includes embodiments of the ink compositions in which the weight ratio of the first mono(meth)acrylate or di(meth)acrylate monomer to the second mono(meth)acrylate or di(meth)acrylate monomer is in the range from 5:1 to 5:4. For the purposes of the weight percentages and weight ratios recited in this paragraph, any crosslinking ligand present in the ink composition is not considered to be a mono(meth)acrylate or di(meth)acrylate monomer.

If one or more crosslinking agents are included in an ink composition according to the present teachings, they typically account for about 1 wt. % to about 10 wt. % of the ink composition, including about 2 wt. % to about 8 wt. % of the ink composition.

According to the present teachings, as previously discussed herein, an NP-containing ink composition can include more than one type of NP, where the different types of NPs can differ by nominal particle size, particles shape, particle material, or combinations thereof. Some exemplary NPs can include, by way of non-limiting example, metal oxide NPs, such as NPs of zirconium oxide (i.e. zirconia), titanium oxide (i.e. titania) and aluminum oxide (i.e. alumina). Embodiments of the ink compositions for use in printing the NP-containing region of a composite film layer formed on a substrate of a light-emitting device may have a NP loading in a concentration in the range from about 1 wt. % to about 60 wt. % for NPs between about 10 nm to about 100 nm. As a result, the mono(meth)acrylate and di(meth)acrylate monomer content of these ink compositions can be lower than discussed above. For example, various embodiments of the NP-containing ink compositions for forming a composite film on a substrate of a light-emitting device may have a mono(meth)acrylate and di(meth)acrylate monomer content in the range from about 50 wt. % to about 90 wt. %. This includes embodiments of the ink compositions having a mono(meth)acrylate and di(meth)acrylate monomer content in the range from about 60 wt. % to 80 wt. % and further includes embodiments of the ink compositions having a mono(meth)acrylate and di(meth)acrylate monomer content in the range from about 65 wt. % to 75 wt. %.

As previously discussed herein, an organic solvent may be added to these ink compositions to provide them with a viscosity and/or surface tension suitable for inkjet printing, as discussed above. Suitable organic solvents include esters and ethers. Examples of organic solvents that can be included in the ink compositions include high boiling organic solvents, including organic solvents having a boiling point of at least 200° C. This includes organic solvents that have boiling points of at least 230° C., at least 250° C., or even at least 280° C. Diols and glycols, such as propanediols, pentanediols, diethylene glycols and triethylene glycols, are examples of high boiling organic solvents that can be used. High boiling aprotic solvents can also be used, including aprotic solvents having boiling points of at least 240° C. Sulfolane, 2,3,4,5-tetrahydrothiophene-1,1-dioxide, also known as tetramethylene sulfone, is an example of a relatively high boiling, aprotic solvent. Other non-limiting exemplary organic solvents can include toluene, xylenes, mesitylene, propylene glycol methyl ethers, methyl naphthalene, methyl benzoate, tetrahydronaphthalene, dimethyl formamide, terpineol, phenoxyethanol, and butyrophenone. If organic solvents are included in the ink compositions, the NP and monomer concentrations cited above are based on the solids content of the ink compositions.

For various embodiments of an ink composition of the present teachings, multifunctional (meth)acrylate crosslinking agents can account for between about 4 wt. % to about 10 wt. % of an ink composition. Generally, the cure initiators, such as photoinitiators, will be included in amounts in the range from about 0.1 wt. % to about 10 wt. %, including amounts in the range from about 0.1 wt. % to about 8 wt. %. This includes embodiments in which the photoinitiators are present in amounts in the range from about 1 wt. % to about 6 wt. %, further includes embodiments in which the photoinitiators are present in amounts in the range from about 3 wt. % to about 6 wt. %, and still further includes embodiments in which the photoinitiators are present in amounts in the range from about 3.75 wt. % to about 4.25 wt. %.

The specific photoinitiators used for a given ink composition are desirably selected such that they are activated at wavelengths that are not damaging to materials used in the fabrication of the device, such as materials used in the fabrication of a light-emitting device, such as, but not limited by an OLED display or lighting device. The photoinitiators can be selected such that initial polymerization is induced at wavelengths in the UV region of the electromagnetic spectrum, the blue region of the visible spectrum, or both. For example, various ink compositions of the present teachings can use a photoinitiator that triggers polymerization at a wavelength in the blue region of the electromagnetic spectrum. Thus, a completely cured composite film layer of the present teachings can be achieved using a light source that emits blue light. For example, an LED source having a peak intensity around 395 nm could be used.

An acylphosphine oxide photoinitiator can be used, though it is to be understood that a wide variety of photoinitiators can be used. For example, but not limited by, photoinitiators from the α-hydroxyketone, phenylglyoxylate, and α-aminoketone classes of photoinitiators can also be considered. For initiating a free-radical based polymerization, various classes of photoinitiators can have an absorption profile of between about 200 nm to about 400 nm. For various embodiments of the ink compositions and methods of printing disclosed herein, 2,4,6-trimethylbenzoyl-diphenylphosphine oxide (TPO) and 2,4,6-trimethylbenzoyl-diphenyl phosphinate have desirable properties. Examples of acylphosphine photoinitiators include Irgacure® TPO (also previously available under the tradename Lucirin® TPO) initiators for UV curing sold under the tradenames Irgacure® TPO, a type I hemolytic initiator which; with absorption @ 380 nm; Irgacure® TPO-L, a type I photoinitiator that absorbs at 380 nm; and Irgacure® 819 with absorption at 370 nm. By way of illustration, a light source emitting at a nominal wavelength in the range from 350 nm to 395 nm at a radiant energy density of up to 1.5 J/cm$^2$ could be used to cure an ink composition comprising a TPO photoinitiator. Using the appropriate energy sources, high levels of curing can be achieved. For example, some embodiments of the cured composite films of the present teachings can have a degree of curing of 90% or greater, as measured by, for example, Fourier Transform Infrared (FTIR) spectroscopy.

Given that the initiation of polymerization can be induced by light, ink compositions can be prepared to prevent exposure to light. With respect to preparation of various compositions of the present teachings, in order to ensure the stability of various compositions, the compositions can be prepared in a dark or very dimly lit room or in a facility in which the lighting is controlled to exclude wavelengths that would induce polymerization. Such wavelengths generally include those below about 500 nm.

Figure 6:
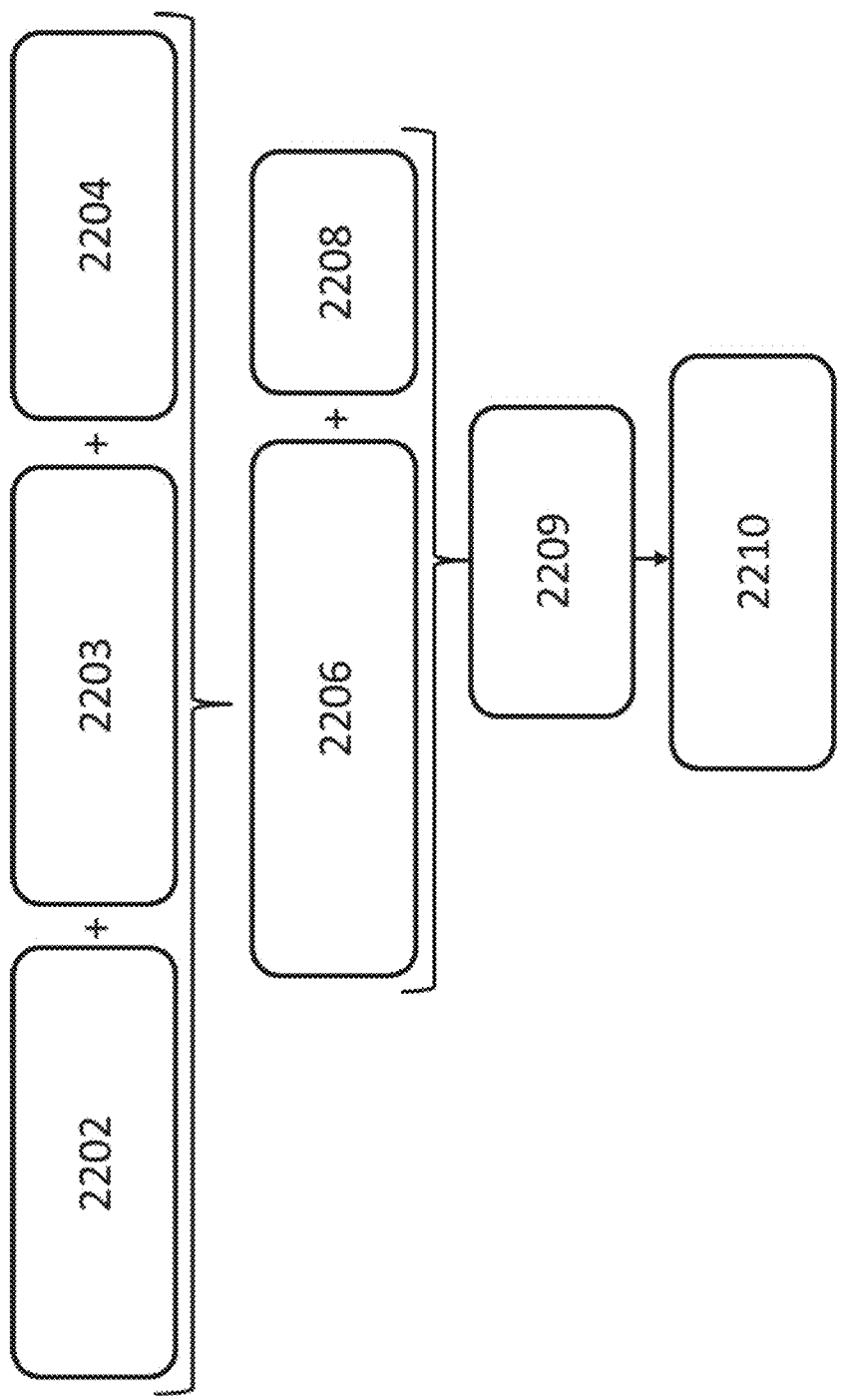
FIG. 6 depicts a flowchart for a method of formulating various ink compositions according to the present teachings.

A flowchart for a method of formulating an ink composition according to the present teachings is provided in FIG. 6. To formulate an ink composition, a mixture 2202 of mono(meth)acrylate monomers, di(meth)acrylate monomers a and combinations thereof, as well as the multifunctional (meth)acrylate crosslinking agent are mixed together with a photoinitiator 2203 to form an initial curable monomeric blend 2206. If the ink composition will include crosslinking ligands 2204, they can also be added to curable monomeric blend 2206. NPS 2008 can be dispersed in curable monomeric blend 2206 to form a dispersion 2209. Various NPs may be added in the form of an aqueous or non-aqueous, organic solvent-based dispersion. If so, water or organic solvent optionally can be removed from dispersion 2209 to form a second dispersion 2 210. The ink composition is then ready for use and should be stored away from light. Once the ink compositions are prepared, they can be dehydrated by mixing in the presence of molecular sieve beads for a period of a day or more and then stored under a dry, inert atmosphere, such as a compressed dry air atmosphere.

The ink compositions can be printed using a printing system, as described subsequently herein, and also as described in U.S. Pat. Nos. 9,343,678 and 9,579,905, which are incorporated herein in their entirety. The films can be cured in an inert nitrogen environment using UV radiation. The ink compositions are designed to be applied by inkjet printing and are, therefore, characterized by jettability, wherein a jettable ink composition displays constant, or substantially constant, drop velocities, drop volumes and drop trajectories over time when jetted continuously through the nozzle of a printhead. In addition, the ink compositions are desirably characterized by good latency properties, where latency refers to the time that nozzles can be left uncovered and idle before there is a significant reduction in performance, for instance a reduction in drop velocity or volume and/or a change in trajectory that will noticeably affect the image quality.

Various embodiments of the present ink compositions can be deposited on a substrate, such as glass substrates or various polymeric substrates, such as substrates formed from the class of polymers such as polyimide, polyethylene terephthalate, cyclic olefin copolymer, and the like, using pattered area printing of inks to form various embodiments of composite film layers of the present teachings.

Printing Systems

Figure 7:
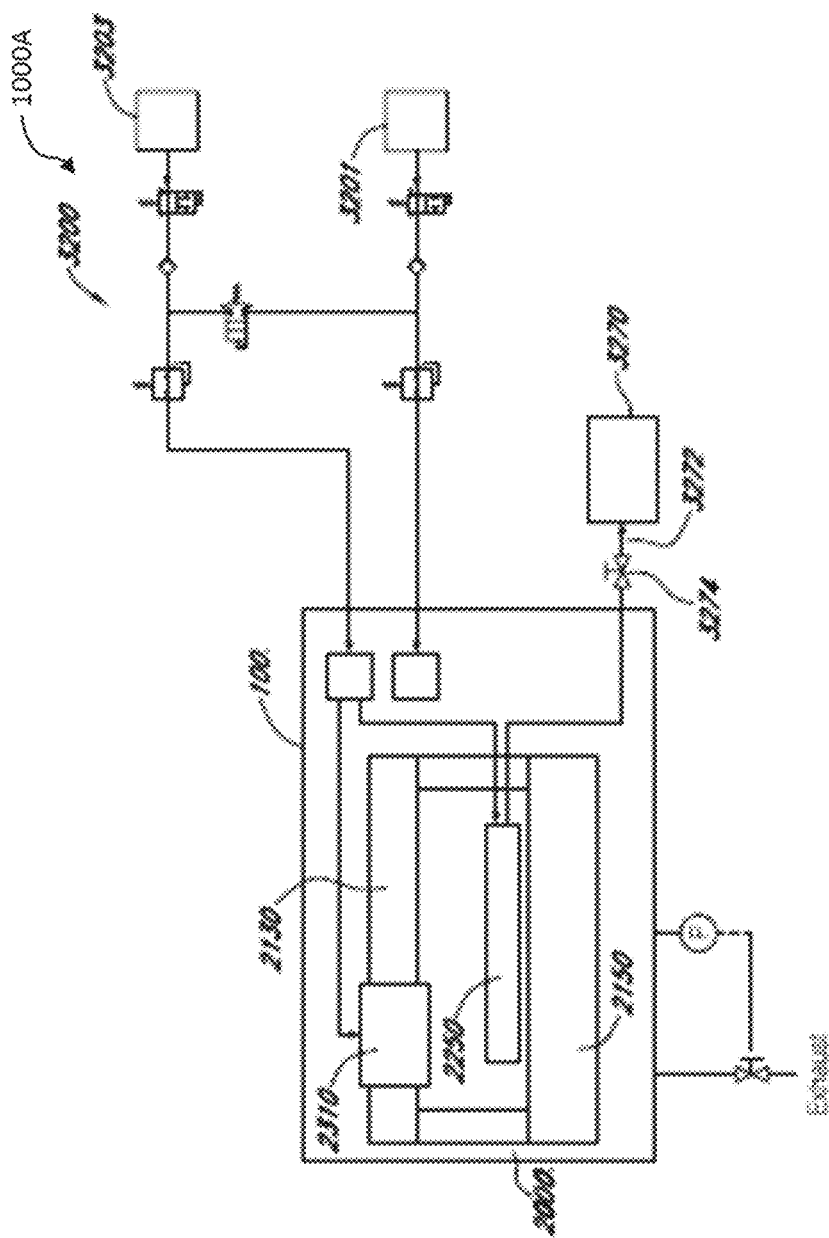
FIG. 7 illustrates generally an exemplary printing system according to various embodiments of systems and methods of the present teachings.

FIG. 7 illustrates generally enclosed inkjet printing system 1000A, for integrating and controlling non-reactive gas and clean dry air (CDA) sources such as can be used to establish the controlled environment referred to in other examples described elsewhere herein, and such as can include a supply of pressurized gas for use with inkjet printing system 2000 shown in the interior of manufacturing enclosure 100. Additionally, enclosed inkjet printing system 1000A of FIG. 7 can include a supply of CDA so as to establish a CDA environment in manufacturing enclosure 100 during, for example, various maintenance procedures.

As depicted in FIG. 7, enclosed inkjet printing system 1000A can have inkjet printing system 2000, housed within manufacturing enclosure 100. Inkjet printing system 2000 can be supported by printing system base 2150, which can be a granite stage. Printing system base 2150 can support a substrate support apparatus, such as a chuck, for example, but not limited by, a vacuum chuck, a substrate floatation chuck having pressure ports, and a substrate floatation chuck having vacuum and pressure ports. In various embodiments of the present teachings, a substrate support apparatus can be a substrate floatation table, such as substrate floatation table 2250 indicated in FIG. 7. Substrate floatation table 2250 can be used for the frictionless support of a substrate. In addition to a low-particle generating floatation table, for frictionless Y-axis conveyance of a substrate, inkjet printing system 2000 can have a Y-axis motion system utilizing air bushings. Additionally, printing system 2000 can have X,Z-axis carriage assembly 2310, which can be mounted on printing system bridge 2130. X,Z-axis carriage assembly 2310 can have motion control provided by a low-particle generating X-axis air bearing assembly. Various components of a low-particle generating motion system, such as an X-axis air bearing assembly, can be used in place of, for example, various particle-generating linear mechanical bearing systems. For various embodiments of a gas enclosure and system of the present teachings, the use of a variety of pneumatically operated devices and apparatuses can provide low-particle generating performance, as well as being low maintenance.

With respect to supply and control of process gas, as depicted in FIG. 7, various embodiments of enclosed inkjet printing system 1000A can have external gas loop 3200 for integrating and controlling non-reactive gas source 3201 and clean dry air (CDA) source 3203 for use in various aspects of operation of enclosed inkjet printing system 1000A. Enclosed inkjet printing system 1000A can also include various embodiments of an internal particle filtration and gas circulation system, as well as various embodiments of an external gas purification system, as previously described herein. Some commonly used non-limiting examples of gases for non-reactive gas source 3201 gas for can include nitrogen, any of the noble gases, and any combination thereof. Various embodiments of a gas purification system according to the present teachings can maintain levels in manufacturing enclosure 100 for each species of various reactive species, including various reactive atmospheric gases, such as water vapor, oxygen and ozone, as well as organic solvent vapors at 100 ppm or lower, for example, at 10 ppm or lower, at 1.0 ppm or lower, or at 0.1 ppm or lower. In addition to a supply of a non-reactive gas, substrate floatation table 2250 of inkjet printing system 2000, which can utilize air bearing technology, can also utilize vacuum system 3270, which is in communication with of manufacturing enclosure system 1000A through line 3272 when valve 3274 is in an open position.

With respect to controlling the internal pressure of manufacturing enclosure 100, as illustrated generally in FIG. 7, a pressure of gas inside manufacturing enclosure 100 can be maintained within a desired or specified range, such as using a valve coupled to a pressure monitor, P, where the valve allows gas to be exhausted to another enclosure, system, or a region surrounding the inside manufacturing enclosure 100 using information obtained from the pressure monitor. Such gas can be recovered and re-processed. As previously discussed herein, such regulation can assist in maintaining a slight positive internal pressure of inside manufacturing enclosure 100 during a printing process. Moreover, variable demand of various pneumatic devices and apparatuses can create an irregular pressure profile for various manufacturing enclosure systems and methods of the present teachings, which requires constant control and regulation. Accordingly, as depicted in FIG. 7 for manufacturing enclosure 100, the pressure control system is configured to maintaining a dynamic pressure balance for manufacturing enclosure system 1000A, so that it can be held at a slight positive pressure relative to the environment surrounding the enclosure during a printing process.

The present teachings are intended to be illustrative, and not restrictive. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

It will be apparent to those skilled in the art that various modifications and variations can be made to the devices, methods, and systems of the present disclosure without departing from the scope of the present disclosure and appended claims. Other embodiments of the disclosure will be apparent to those skilled in the art from consideration of the specification and practice of the disclosure disclosed herein. It is intended that the specification and examples be considered as exemplary only.

What is claimed is:

1. An optoelectronic device comprising:
   a material layer that forms part of the optoelectronic device, the material layer comprising a first material;
   a composite polymeric film on the material layer, the composite polymeric film comprising a first pattern of polymeric areas and a second pattern of polymeric areas, wherein the polymeric areas of the first pattern of polymeric areas are in direct physical contact with the material layer and the polymeric areas of the second pattern of polymeric areas are in direct physical contact with the material layer;
   a film layer over the composite polymeric film, wherein the polymeric areas of the first pattern of polymeric areas have refractive indices that are closer to the refractive index of the material layer than to the refractive index of the film layer, and further wherein the polymeric areas of the second pattern of polymeric areas have refractive indices that are closer to the refractive index of the film layer than to the refractive index of the material layer; and
   wherein the film layer is an anode.

2. The device of claim 1, wherein the refractive index of the material layer is in the range from 1.45 to 1.5.

3. The device of claim 2, wherein the refractive indices of the polymeric areas of the first pattern of polymeric areas are in the range from 1.45 to 1.5.

4. The device of claim 1, wherein the refractive index of the film layer is in the range from 1.6 to 1.9.

5. The device of claim 4, wherein the refractive indices of the polymeric areas of the second pattern of polymeric areas are in the range from 1.6 to 1.9.

6. The device of claim 1, wherein the polymeric areas of the first pattern of polymeric areas comprise a polymerization product of an acrylate monomer, a methacrylate monomer, or combinations thereof.

7. The device of claim 6, wherein the polymeric areas of the second pattern of polymeric areas comprise the polymerization product of an acrylate monomer, a methacrylate monomer, or combinations thereof, and nanoparticles.

8. The device of claim 7, wherein the nanoparticles comprise zirconium oxide nanoparticles, titanium oxide nanoparticles, or aluminum oxide nanoparticles.

9. The device of claim 8, wherein the film layer comprises metal nanowires.

10. The device of claim 1, wherein the optoelectronic device is an organic light emitting diode.

11. The device of claim 1, wherein the first material is glass.

12. The device of claim 1, wherein the first material is a polymeric material.

13. The device of claim 1, wherein the polymeric areas of the first pattern of polymeric areas are in direct physical contact with the film layer and the polymeric areas of the second pattern of polymeric areas are in direct physical contact with the film layer.

14. The device of claim 1, wherein the polymeric areas of the first pattern of polymeric areas are dome-shaped.

15. The device of claim 1, wherein the film layer comprises metal nanowires.

16. An optoelectronic device comprising:
a material layer that forms part of the optoelectronic device, the material layer comprising a first material;
a composite polymeric film on the material layer, the composite polymeric film comprising a first pattern of polymeric areas and a second pattern of polymeric areas, wherein the polymeric areas of the second pattern of polymeric areas are in direct physical contact with the material layer and comprise the polymerization product of an acrylate monomer, a methacrylate monomer, or combinations thereof, and nanoparticles; and
an anode comprising metal nanowires over the composite polymeric film, wherein the polymeric areas of the first pattern of polymeric areas are in direct physical contact with the material layer and have refractive indices that are closer to the refractive index of material layer than to the refractive index of the anode, and further wherein the polymeric areas of the second pattern of polymeric areas have refractive indices that are closer to the refractive index of the anode than to the refractive index of the material layer.

17. The device of claim 16, wherein the nanoparticles comprise zirconium oxide nanoparticles, titanium oxide nanoparticles, or aluminum oxide nanoparticles.

* * * * *